(12) United States Patent
Gogl et al.

(10) Patent No.: US 6,778,431 B2
(45) Date of Patent: Aug. 17, 2004

(54) ARCHITECTURE FOR HIGH-SPEED MAGNETIC MEMORIES

(75) Inventors: Dietmar Gogl, Essex Junction, VT (US); William Robert Reohr, Ridgefield, CT (US); Roy Edwin Scheuerlein, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/318,709

(22) Filed: Dec. 13, 2002

(65) Prior Publication Data

US 2004/0114439 A1 Jun. 17, 2004

(51) Int. Cl.[7] .................................................. G11C 7/00
(52) U.S. Cl. .............. 365/171; 365/189.02; 365/189.09
(58) Field of Search ................................ 365/170, 171, 365/189.02, 189.09

(56) References Cited

U.S. PATENT DOCUMENTS 6,236,611 B1 * 5/2001 Naji ........................... 365/226
6,269,040 B1    7/2001 Reohr et al.

OTHER PUBLICATIONS

W. Reohr et al., "Memories of Tomorrow," *IEEE Circuits & Devices Magazine*, vol. 18, No. 5, pp. 17–27, Sep. 2002.

* cited by examiner

Primary Examiner—Vu A. Le
(74) Attorney, Agent, or Firm—Wan Yee Cheung; Ryan, Mason & Lewis, LLP

(57) ABSTRACT

A magnetic memory circuit comprises a plurality of memory cells and a plurality of bit lines coupled to the memory cells for selectively accessing one or more of the memory cells. The memory circuit comprises at least one bit line programming circuit, configurable as a current source for generating a programming current for writing a logical state of at least one memory cell and/or a current sink for returning the programming current, and a first set of switches. The first set of switches are disabled at least during a read operation of the memory cells and at least a portion of the first set of switches are selectively enabled during a write operation of the memory cells. Each switch in the first set of switches is configured to selectively couple the at least one bit line programming circuit to a corresponding one of the bit lines in response to a first control signal. The memory circuit further comprises at least one sense amplifier and a second set of switches. The second set of switches are disabled at least during a write operation of the memory cells and at least a portion of the second set of switches are selectively enabled during a read operation of the memory cells. Each switch in the second set of switches is configured to selectively couple the at least one sense amplifier to a corresponding one of the bit lines in response to a second control signal.

26 Claims, 5 Drawing Sheets

ARCHITECTURE FOR HIGH-SPEED MAGNETIC MEMORIES

STATEMENT OF GOVERNMENT RIGHTS

This invention was made with Government support under grant contract number MDA972-99-C-0009 awarded by the Defense Advanced Research Projects Agency (DARPA) of the United States Department of Defense. The Government has certain rights in this invention.

FIELD OF THE INVENTION

The present invention relates generally to memory circuits, and more particularly relates to techniques for reading and writing magnetic random access memory (MRAM).

BACKGROUND OF THE INVENTION

FIG. 1 illustrates a conventional magnetic tunnel junction (MTJ) device 100. The MTJ 100 is typically comprised of a stack of two ferromagnetic layers (ML) separated by a tunnel barrier (TL) at a cross-point of two conductors, one of which may be a word line (WL) and the other a bit line (BL). One of the two magnetic layers is often referred to as a free magnetic layer. The magnetic orientation of the free magnetic layer can be changed by the superposition of magnetic fields generated by programming currents $I_{WL}$ and $I_{BL}$ flowing in the conductors WL and BL, respectively. The other of the two magnetic layers ML is often referred to as a fixed magnetic layer. The programming currents $I_{WL}$ and $I_{BL}$ cannot change the magnetic orientation of the fixed magnetic layer. The logical state (e.g., a "0" bit or a "1" bit) is generally stored in the MTJ 100 by changing the orientation of the free magnetic layer relative to the fixed magnetic layer. When both magnetic layers have the same orientation, the MTJ 100 typically has a low resistance $R_C$ associated therewith, as measured between conductors WL and BL. Likewise, the resistance $R_C$ of the MTJ 100 is generally high when the magnetic layers are oriented in opposite directions with respect to one another.

A conventional MRAM generally includes a plurality of MTJ devices connected in an array configuration. Two examples of conventional MRAM arrays are shown in FIGS. 2A and 2B. FIG. 2A illustrates a cross-point array, wherein each memory cell comprises a single MTJ device connected at an intersection of a word line (e.g., $WL_{k-1}$, $WL_k$, $WL_{k+1}$) and a corresponding bit line (e.g., $BL_{i-1}$, $BL_i$, $BL_{i+1}$). The MTJ devices are depicted in the figure as representative resistances (e.g., $R_C$). FIG. 2B illustrates an alternative memory architecture employing a plurality of memory cells, each cell comprising a selection transistor coupled in series with an MTJ device (i.e., a 1T1MTJ memory cell). The selection transistor is used for accessing the corresponding MTJ device during a read operation. MRAM circuits are discussed in further detail, for example, in the article by W. Reohr et al., entitled "Memories of Tomorrow," *IEEE Circuits and Devices Mag.*, pp. 17–27, Vol. 18, No. 5, September 2002, which is incorporated herein by reference.

In order to apply the programming currents, necessary to write the logical state of a selected memory cell, and read out data from the bit lines in the memory array, a column selector circuit (not shown) is typically required. The column selector circuit generally connects a selected bit line with a programming circuit, which provides the cell programming current during a write operation of the memory cell. The column selector circuit also connects the selected bit line to a sense amplifier (not shown) during a read operation of the selected memory cell in order to sense the programmed logical state of the cell.

A conventional MRAM array generally employs a single current source for supplying one of the two programming currents for selectively writing the memory cells in the MRAM array (e.g., $I_{BL}$ or $I_{WL}$ in FIG. 1). Generally, within a magnetic memory array, one word line current is required to aid in the selection of one or more memory cells in the array. One or more bit line currents, for one or more respective memory cells of a one or more bit word, are required for writing the memory cells to a zero or one logical state. As stated above, word lines and bit lines routed throughout the memory array convey the programming and sense currents for writing and reading, respectively, selected memory cells in the array. However, each of these word and bit lines has a distributed capacitance associated therewith which increases as a function of the length of the word or bit line. Since the distances between the programming current source and sense current source to the selected memory cell can be significant, especially in larger memory arrays, the corresponding load capacitance associated with the word or bit lines in the selected signal path may likewise be relatively large. In addition, switching circuitry associated with the read and write paths typically contributes significantly to the overall load capacitance. This load capacitance can adversely impact the speed of the memory device.

There exists a need, therefore, for an improved MRAM architecture which addresses the above-mentioned problems exhibited in a conventional MRAM array.

SUMMARY OF THE INVENTION

The present invention is directed to techniques for improving the speed of accessing memory cells in a magnetic memory circuit during a read and/or write operation. The invention, in at least one aspect, accomplishes this by reducing the load capacitance on the bit lines and/or word lines coupled to the memory cells, due primarily to the presence of large switching circuitry (e.g., switches, multiplexers (MUXs), etc.) operatively connected to the bit lines and word lines for selectively directing a sense current and/or programming current through the bit lines and word lines, respectively.

Since a significantly smaller current is used during the read operation to sense the logical state of one or more memory cells, by segregating the switches into a plurality of separate read switches and write switches used for reading and writing, respectively, the read switches can be made considerably smaller compared to the corresponding write switches. The smaller switches will have a significantly reduced capacitance associated therewith, thereby improving the speed of the read operation. Additionally, the speed of the write operation may be significantly improved by dividing a programming current source, which supplies the programming current for writing the logical state of the memory cells for each datum input along a bit line dimension, into a plurality of current sources, each current source coupled to a group of one or more corresponding write bit switches. Therefore, the load capacitances from the write bit switches can be divided among the plurality of corresponding current sources. In this manner, no one current source experiences the total load capacitance, thus reducing the capacitance on the output of each of the current sources and thereby improving the speed of the write operation.

In accordance with one aspect of the invention, a magnetic memory circuit comprises a plurality of memory cells and a plurality of bit lines coupled to the memory cells for selectively accessing one or more of the memory cells. The memory circuit comprises at least one bit line programming circuit, configurable as a current source for generating a programming current for writing a logical state of at least one memory cell and/or a current sink for returning the programming current, and a first set of switches. The first set of switches are disabled at least during a read operation of the memory cells and at least a portion of the first set of switches are selectively enabled during a write operation of the memory cells. Each switch in the first set of switches is configured to selectively couple the at least one bit line programming circuit to a corresponding one of the bit lines in response to a first control signal. The memory circuit further comprises at least one sense amplifier and a second set of switches. The second set of switches are disabled at least during a write operation of the memory cells and at least a portion of the second set of switches are selectively enabled during a read operation of the memory cells. Each switch in the second set of switches is configured to selectively couple the at least one sense amplifier to a corresponding one of the bit lines in response to a second control signal.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described herein in the context of an illustrative magnetic random access memory (MRAM) device. It should be appreciated, however, that the present invention is not limited to this or any particular magnetic memory circuit or architecture. Rather, the invention is more generally applicable to techniques for reducing a load capacitance on the read and/or write signal path in a magnetic memory circuit. Moreover, although implementations of the present invention may be described herein with reference to magnetic tunnel junction (MTJ) devices, it should be appreciated that the invention is not limited to such devices, and that other suitable devices, such as, for example, other magneto-resistive memory elements, may be similarly employed with or without modifications to the inventive magnetic memory architecture.

As will be understood by those skilled in the art, "word lines" are generally defined as being oriented in a row or horizontal direction, while "bit lines" are generally defined as being oriented in a column or vertical direction. It is to be appreciated, however, that the techniques of present invention described herein are not limited to this or any particular orientation of word lines and/or bit lines.

Figure 1:
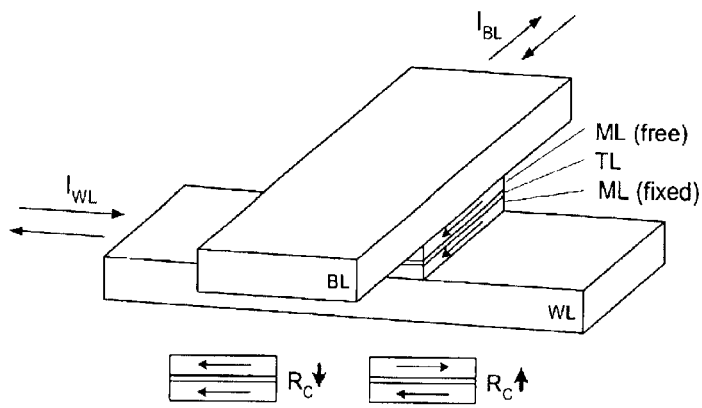
FIG. 1 is a graphical illustration depicting a conventional magnetic tunnel junction device.
Figure 2A:
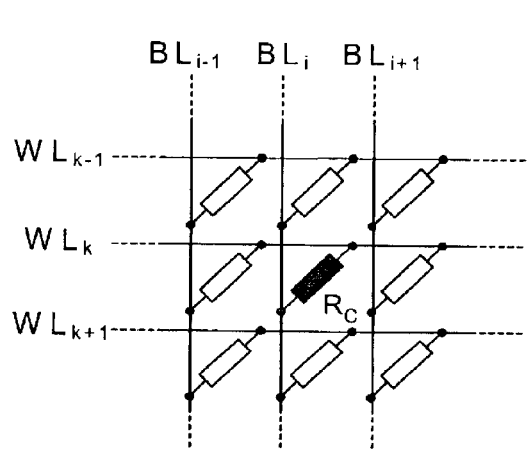
FIG. 2A is a schematic diagram illustrating at least a portion of a conventional cross-point memory array.
Figure 2B:
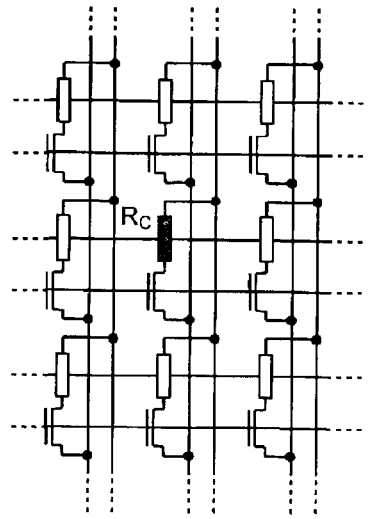
FIG. 2B is a schematic diagram illustrating at least a portion of a conventional 1T1MTJ memory cell array.
Figure 3:
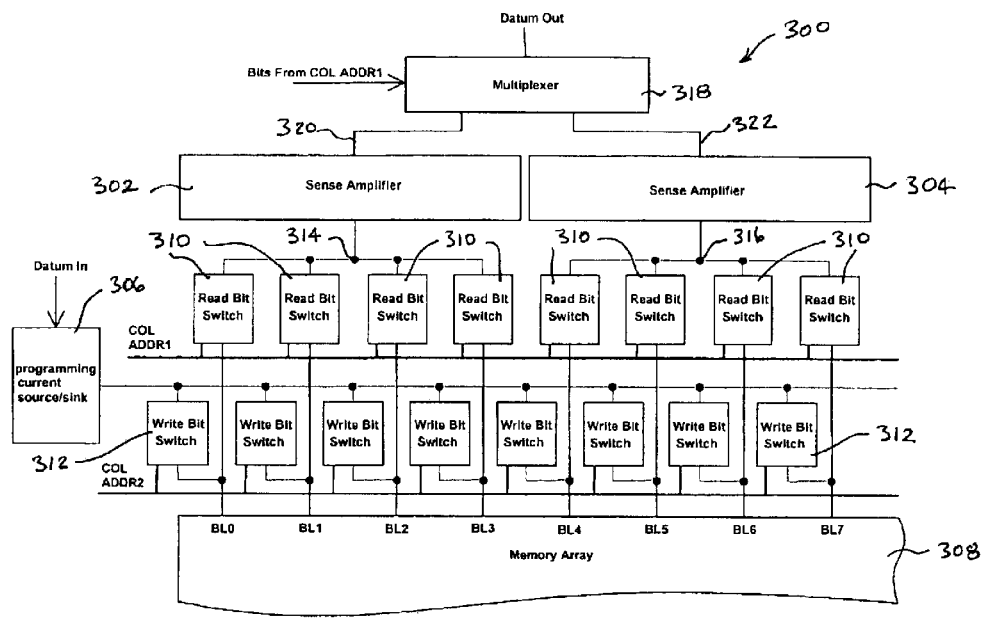
FIG. 3 is a block diagram illustrating an exemplary magnetic memory circuit for reading and/or writing memory cells, formed in accordance with one aspect of the invention.

FIG. 3 depicts an illustrative magnetic memory circuit 300 in which the techniques of the present invention may be implemented. The illustrative magnetic memory circuit 300 comprises a memory array 308 including a plurality of memory cells (not shown), which may be configured in a conventional manner (e.g., as a 1T1MTJ memory array), and a plurality of bit lines BL0, BL1, BL2, BL3, BL4, BL5, BL6, BL7, etc., operatively coupled to the memory cells for selectively accessing the memory cells in the memory array 308. The number of bit lines employed will depend, at least in part, on the number and arrangement of memory cells in the memory array 308. The present invention, however, is not limited to the number of bit lines used.

For designing a high-speed magnetic memory architecture, it is desirable to reduce the capacitive load associated with a given read (i.e., sense) signal path as much as possible. One way to accomplish this is to separate at least a portion of the read signal path from the write signal path, as will be explained in further detail below.

The write signal path typically has a large load capacitance associated therewith due, at least in part, to the presence of write bit switches 312 coupled to the write signal path. The write bit switches 312 must be sized appropriately to handle a large programming current (e.g., about 2 to 6 milliamperes (mA)) which may be required for writing the logical states of the respective memory cells. The write bit switches 312 may each comprise a transistor, such as, for example, an n-type field-effect transistor (NFET), functioning as a voltage controlled switch. The present invention similarly contemplates that alternative circuitry (e.g., MUX) may be employed for implementing the write bit switches 312, as will be understood by those skilled in the art.

A first terminal (e.g., a drain terminal of the NFET) of each of the write bit switches 312 is preferably coupled to a programming current source/sink 306. The current source/sink 306 preferably includes an output for generating the programming current, used for writing one or more selected memory cells, and a datum input (Datum In) which controls the direction of the programming current. Current source/sink 306 is preferably configurable as either a current source, for supplying a controlled current, or as a current sink, for returning the programming current. As previously explained, the direction of the programming current is what ultimately determines the logical state that is written into a memory cell. A second terminal (e.g., a source terminal of the NFET) of each of the write bit switches 312 is preferably coupled to a corresponding bit line (e.g., BL0, BL1, BL2, etc.) associated with the memory array 308. Thus, in the illustrative magnetic memory circuit 300, there preferably exists a corresponding write bit switch 312 for each bit line in the memory array 308.

The write bit switches 312 in the illustrative magnetic memory circuit 300 may include one or more control inputs for selectively connecting the output of the programming current source/sink 306 to a given bit line in response to one or more control signals presented thereto. The control signal may comprise, for example, a partially or fully decoded address (COL ADDR2) which, when presented to a plurality of the write bit switches 312, may be further decoded by circuitry (not shown), such as, for example, a decoder included in the write bit switches 312 for selectively activating a given write bit switch. This COL ADDR2 address preferably comprises a write signal, or alternative signal(s), such that at least a portion of the write bit switches 312 are active (i.e., enabled) only during a write operation. When such decode circuitry is not incorporated into the write bit switches 312, a separate decoder (not shown) external to the write bit switches may be included in the illustrative magnetic memory circuit 300. Alternative decoding arrangements are similarly contemplated by the invention.

In accordance with one aspect of the invention, the illustrative magnetic memory circuit 300 comprises one or more sense amplifiers 302, 304 located in close relative proximity to the corresponding memory cells to be read. The memory cells to be read represent at least a portion of the memory cells in the memory array 308. The sense amplifiers 302, 304 are preferably selectively coupled to the memory cells via a plurality of read bit switches 310. The read bit switches 310 in the illustrative magnetic memory circuit 300 are separate from the write bit switches 312 and preferably function in a manner consistent with the write bit switches 312 previously described. However, since a substantially smaller current is used for sensing the logical state of the memory cells during the read operation (e.g., about 50 microamperes ($\mu$A)), each of the read bit switches 310 may comprise an appreciably smaller transistor (e.g., NFET) compared to the transistors used in the write bit switches 312. Preferably, the transistors in the read bit switches are sized to be at least about four times smaller than the transistors in the write bit switches. The illustrative magnetic memory circuit 300 thus significantly minimizes the load capacitance due, at least in part, to drain and/or source diffusions associated with the transistors in the read bit switches connected in the read signal path.

Like the write bit switches 312, each of the read bit switches 310 may include a first terminal coupled to one of the sense amplifiers 302, 304 at an input node 314, 316, respectively, of the sense amplifier, and a second terminal coupled to a corresponding bit line (BL0, BL1, etc.) in the memory array 308. The read bit switches 310 may include one or more control inputs for selectively connecting a corresponding sense amplifier to a given bit line associated with that sense amplifier in response to one or more control signals presented thereto. The control signal may comprise, for example, a fully or partially decoded address (COL ADDR1) which, when presented to a plurality of the read bit switches 310, may be further decoded by circuitry (not shown) included in the read bit switches 310 for selectively activating a given switch. This COL ADDR1 address preferably comprises a read signal, or alternative signal(s), such that the read bit switches 310 are active (i.e., enabled) only during a read operation.

As previously explained in conjunction with write bit switches 312, when the read bit switches 310 do not include decode circuitry, a decoder (not shown) external to the read bit switches 310 may be included in the memory architecture 300 for decoding the address COL ADDR1. The same decoder may be configurable for generating the control signals for selecting one or more of the write bit switches 312 and read bit switches 310.

The illustrative magnetic memory circuit 300 may further comprise a multiplexer 318 for selecting data from one of the plurality of sense amplifiers 302, 304. The multiplexer 318 preferably includes a plurality of data inputs 320, 322, at least one control input, and at least one datum output (Datum Out). For $2^n$ inputs, the multiplexer preferably includes n control inputs for receiving an n-bit control signal (address), where n is an integer greater than zero. Each of the data inputs 320, 322 is coupled to an output of a corresponding sense amplifier 302, 304, respectively. The multiplexer 318 preferably passes data from one of the plurality of inputs in response to a control signal or signals presented to the at least one control input. The control signals may comprise, for example, at least a portion of the COL ADDR1 address used to select one or more of the read bit switches 310, as previously discussed.

Since the sense amplifiers 302, 304 are preferably localized (i.e., can be located in closer proximity) to the memory cells being read, the length of the overall read path and the cumulative number of circuits connected in the read path associated with a given memory cell can be reduced, thereby further minimizing the load capacitance. The reduction in load capacitance advantageously improves the speed of the read operation in the illustrative magnetic memory circuit 300. Moreover, the illustrative magnetic memory circuit 300 provides a more symmetrical bit line wiring arrangement. This is especially advantageous when differential sense amplifiers are employed, whereby noise on the bit lines could otherwise adversely couple asymmetrically onto the bit lines. Some advantages of using symmetrical bit line wiring are discussed, for example, in U.S. Pat. No. 6,269, 040 to Reohr et al., which is incorporated herein by reference.

As previously explained, an important aspect of the present invention is the separation of the read signal path from the write signal path, which generally has a significantly higher load capacitance associated therewith. Connecting the sense amplifiers through the same switch as the programming current source, as is conventionally done, produces a large capacitive load on the read path and at the sense amplifier input, which would slow down the sensing process associated with the read operation. Instead, multiple sense amplifiers 302, 304 are connected to the bit lines through separate read bit switches 310 that are sized to be appreciably smaller than the write bit switches 312 coupled to the programming current source/sink 306 since, as stated above, each read bit switch 310 only needs to carry a sense current on the order of about 50 $\mu$A. In this manner, each read path to a given sense amplifier 302, 304 is only loaded with the capacitance of smaller read bit switches 310 and the capacitance contributed by the selected bit line.

An additional advantage of the illustrative memory circuit 300 of the present invention is that the decoding of the write bit switches 312 coupled to the programming current source/ sink 306 and the read bit switches 310 coupled to the sense amplifiers 302, 304 can be controlled independently. Consequently, a different number of bit lines can be connected to the programming current source/sink 306 than is connected to a given sense amplifier. This advantageously allows a reduction in the number of current sources compared to the number of sense amplifiers. For calibration purposes, a smaller number of current sources is desirable, while a larger number of sense amplifiers advantageously provides local amplification that mitigates signal noise and minimizes read path delay.

In order to help guarantee proximity to the bit lines, the sense amplifiers in the illustrative memory circuit 300 may be placed directly on top of a slice of a certain number of bit lines. The term "slice" as used herein is intended to refer to a plurality of memory cells aligned in a particular dimension (e.g., a column). Arranging the sense amplifiers in this manner helps insure substantially equal read path lengths and capacitive loads. The write bit switch and/or the sense amplifier can be placed at or near a border of the memory array 308, depending on limitations of the programming current, which may be affected by line resistance, or read access time, which may be affected by noise, capacitive loads, etc.

To achieve sufficient programming yield using a larger number of magnetic memory cells arranged in a memory array, the programming currents used for writing the logical states of the memory cells are preferably substantially held within a desired current range. Controlling the programming current to be within a well-defined current range ensures that only targeted memory cells are programmed, and that all other non-targeted memory cells in the array are substantially undisturbed. In this manner, only selected memory cells in the array will be written, and unselected memory cells will maintain their logical states.

Figure 4:
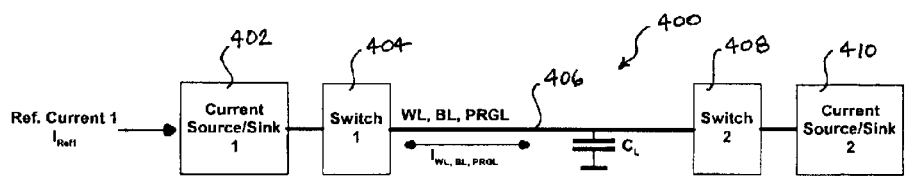
FIG. 4 is a block diagram depicting an illustrative exemplary programming current path.

FIG. 4 illustrates an illustrative programming current path 400 in an MRAM device. As apparent from the figure, the illustrative current programming path 400 comprises a first current source/sink 402 connected by a first switch 404 to a first end of a conductor 406, which may represent, for example, a word line (WL), bit line (BL), or programming line (PRGL) in the memory array. It is to be appreciated that a programming line is intended to refer to any conductor that is used to write the logical state of a magnetic memory cell, and thus a programming line may be either a word line or a bit line. A second end of conductor 406 may be coupled to a second current source/sink 410 via a second switch 408. The current sources/sinks 402, 410 are preferably selectively configurable for either supplying current to another current sink, or returning current from another current source.

The current source/sink 402 coupled to the first end of conductor 406 and the current source/sink 410 coupled to the second end of conductor 406 preferably control the direction and amount of programming current $I_{WL}$, $I_{BL}$, $I_{PRGL}$ flowing in the word line, bit line, or program line, respectively. This bi-directional current arrangement is necessary in order to write a logical "0" or a logical "1" into a selected memory cell. Unidirectional configurations, wherein one end of the conductor 406 is fixed to a predetermined voltage potential, which may be ground, are also contemplated by the invention. It is to be appreciated that a current source/sink may be shared by multiple switches.

Figure 5:
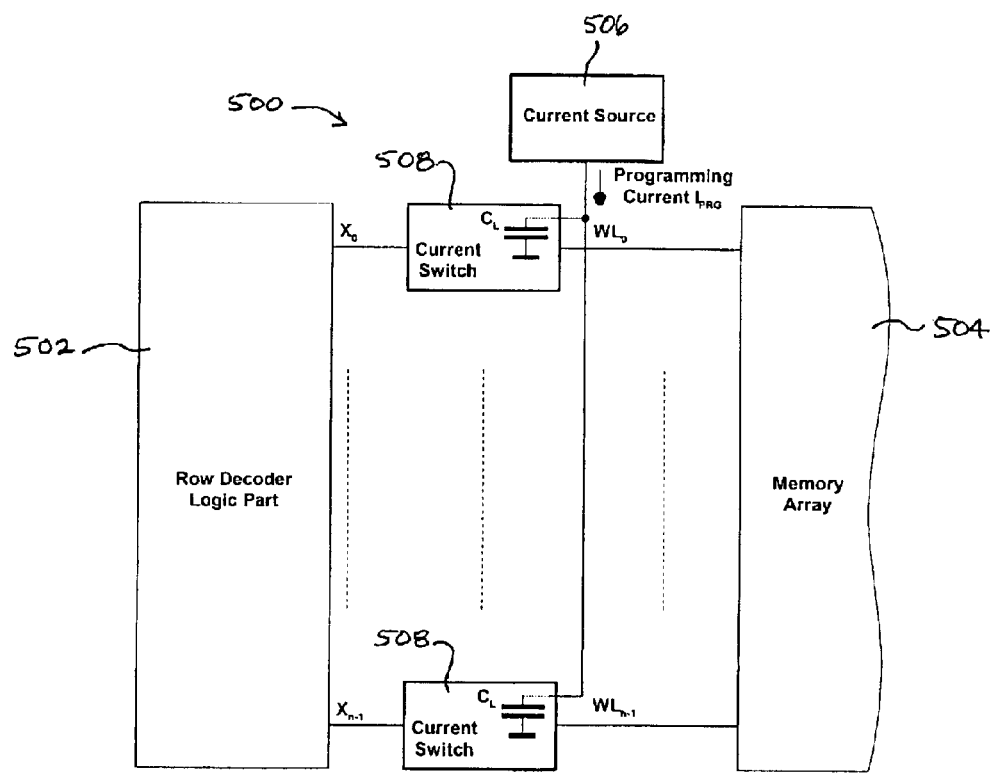
FIG. 5 is a block diagram depicting a programming circuit for controlling the application of a programming current to selected memory cells in a magnetic memory array.

FIG. 5 depicts a programming circuit 500 comprising a row decoder 502, a plurality of current switches 508 coupled to the row decoder 502, and a current source 506 which generates a programming current $I_{PRG}$. The row decoder 502 may be used to control the application of the programming current $I_{PRG}$ along one of n word lines $WL_0$ to $WL_{n-1}$, associated with a memory array 504, where n is an integer greater than one. As previously stated, word lines are generally defined as being oriented in a row or horizontal direction, while bit lines are generally defined as being oriented in a column or vertical direction.

Each output $X_0$ to $X_{n-1}$ of the row decoder 502 drives an independent current switch 508 corresponding thereto. A first terminal (terminal 1) of each of the current switches 508 is coupled to an output of the current source 506, a second terminal (terminal 2) of each current switch 508 is connected to a corresponding word line ($WL_0$ to $WL_{n-1}$) in the memory array 504, and a third terminal (terminal 3) of the each current switch 508 is connected to a corresponding output $X_0$ to $X_{n-1}$, respectively, of the row decoder 502. The current switches 508 selectively couple the current source 506 to a selected word line ($WL_0$ to $WL_{n-1}$) of the memory array 504 in response to a control signal generated by the row decoder 502. The row decoder 502 ensures that only one current switch 508 is enabled at a time.

One disadvantage of programming circuit 500 is that the rise and fall times of the programming current pulse are considerably slow, due primarily to a large load capacitance present on the output of the current source 506. This large load capacitance results, at least in part, from a sum of load capacitances $C_L$ contributed by each of the current switches 508 coupled to the output of the current source 506. As previously explained, the switches 508 must be appropriately sized to handle a programming current of several milliamperes, and thus have large load capacitances $C_L$ associated therewith. These load capacitances, which appear as a large lumped capacitance on the output of the programming current source 506, must be charged by the current source and likewise discharged by a current sink, thereby significantly increasing the rise and fall times, respectively, of the programming current pulse, and increasing power consumption as well.

Figure 6:
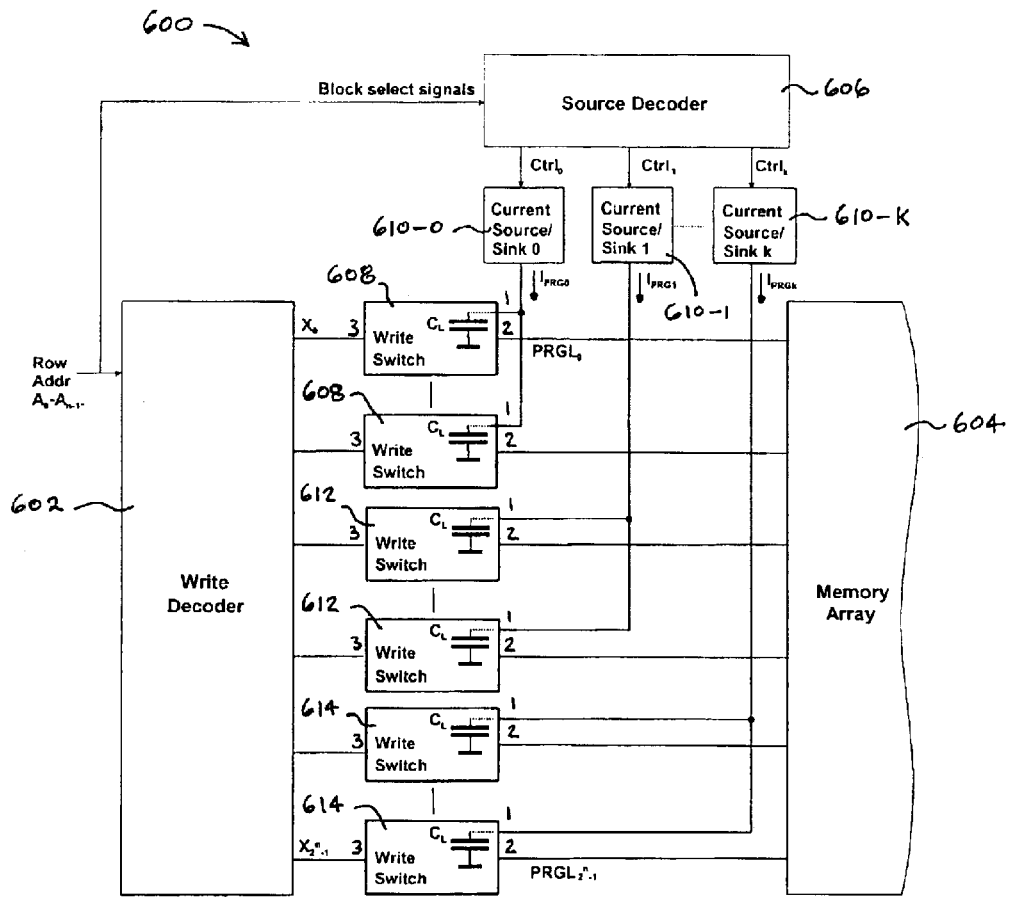
FIG. 6 is a block diagram illustrating an exemplary improved programming circuit, formed in accordance with one aspect of the invention.

FIG. 6 depicts an exemplary programming circuit 600 that provides an improved rise and fall time response of the programming current pulse, in accordance with one aspect of the invention. The exemplary programming circuit 600 comprises a memory array 604, which may include a plurality of memory cells (not shown), and a write decoder 602 including n inputs, for receiving an n-bit row address ($A_0$ to $A_{n-1}$), and $2^n$ outputs $X_0$ to $X_{2^n-1}$, where n is an integer greater than one. The write decoder 602 generates a control signal on one of the outputs $X_0$ to $X_{2^n-1}$ in response to the input address $A_0$ to $A_{n-1}$. Decoders suitable for use with the present invention are known by those skilled in the art. The exemplary programming circuit 600 comprises a plurality of write switches 608, 612, 614 arranged in a bit or word orientation, or a combination of both, each subset including at least one switch. Other orientations are similarly contemplated by the invention (e.g., diagonal orientation). Each of the write switches 608, 612, 614 preferably includes a first terminal (terminal 1) coupled to a programming current source/sink, a second terminal (terminal 2) coupled to a corresponding programming line ($PRGL_0$ to $PRGL_{2^n-1}$) in the memory array 604, and at least one control input (terminal 3) coupled to a corresponding output of the write decoder 602, such that the total number of write switches 608, 612, 614 is preferably equal to the number of outputs of the decoder 602.

In accordance with one aspect of the invention, in order to reduce the capacitive load on the output of the current source 506 shown in FIG. 5, and thus decrease the rise and fall times of the programming current pulse, the write switches 608, 612, 614 along a same dimension (i.e., slice) are preferably arranged into two or more subsets (i.e., blocks), with each subset including at least one write switch. For example, a first subset may be defined to include write switches 608, a second subset may include write switches 612, and a third subset may include write switches 614.

In exemplary programming circuit 600, the programming current source (506 in FIG. 5) traditionally associated with the write switches in a same dimension, is divided into a plurality of current sources/sinks 610-0 to 610-k, where k is an integer greater than zero. The current sources/sinks 610-0 to 610-k are preferably substantially matched to one another, and may be implemented in a manner consistent with the programming current source/sink 306 shown in FIG. 3. Moreover, at least a portion of the current sources/sinks 610-0 to 610-k may be located in close relative proximity to the memory cells corresponding thereto, thereby reducing the length of the programming current path and thus further reducing the load capacitance associated therewith.

Each current source/sink 610-0, 610-1, 610-k is preferably coupled to a corresponding subset of write switches 608, 612, 614, respectively. Preferably, the number of write switches in each subset is substantially the same, thereby evenly distributing the load capacitance $C_L$ contributions of the write switches among the current sources/sinks. The exemplary programming circuit 600 is configured to advantageously ensure that no particular current source/sink experiences a large load capacitance on its output, since the total number of write switches coupled to a given current source/sink may be divided across multiple current sources/sinks as explained above. Accordingly, each of the current sources/sinks 610-0 to 610-k drives a smaller number of write switches, and thus drives a smaller load capacitance than it would otherwise be required to drive if only a single current source/sink were employed.

Since all current sources/sinks need not be continuously active, each of the current sources/sinks 610-0, 610-1, 610-k in the exemplary programming circuit 600 may include at least one control input for selectively enabling a desired current source/sink in response to a control signal $Ctrl_0$, $Ctrl_1$, $Ctrl_k$, respectively, presented thereto. The control signals $Ctrl_0$, $Ctrl_1$, $Ctrl_k$, may be generated by a source decoder 606 comprised in the exemplary programming circuit 600. Alternative circuitry for selectively activating a given current source/sink is similarly contemplated by the present invention. The source decoder 606 preferably includes at least one input, for receiving at least a portion of the row address $A_0$ to $A_{n-1}$, or alternative block select signals, and a plurality of outputs coupled to the control inputs of the current sources/sinks 610-0 to 610-k.

The programming current paths, including current sources/sinks 610-0 to 610-k, write switches 608, 612, 614, and programming lines $PRGL_0$ to $PRGL_{2^n-1}$, in the exemplary programming circuit 600, may be configured in a manner consistent with the programming current path 400 previous described in conjunction with FIG. 4. Thus, although not depicted, each of the programming lines $PRGL_0$ to $PRGL_{2^n-1}$, is preferably terminated by a corresponding current source/sink, which may simply comprise a shunt to a controlled voltage potential (e.g., ground). In a bi-directional current arrangement, current source/sinks 610-0 to 610-k may be selectively configurable as either a current source or a current sink. In a unidirectional current arrangement, current sources/sinks 610-0, 610-1, 610-k may be configured as current sources supplying bi-directional currents $I_{PRG0}$, $I_{PRG1}$, $I_{PRGk}$, respectively, to the corresponding group of write switches, as will be understood by those skilled in the art.

During a write operation, the source decoder 606 preferably enables only the current source/sink associated with a selected write switch (i.e., the selected write switch being enabled by the write decoder 602). Since programming circuit 600 is not limited to the number of subsets of switches, and since the size of a given subset can include essentially any number of write switches, the rise and fall times of the programming current pulse may be controlled as desired by varying the number of write switches in a given subset and/or the number of subsets in the programming circuit 600. The number of switches associated with a given subset or subsets can be varied either manually, automatically (e.g., by a controller or alternative control circuitry (not shown)), or a combination of both, in accordance with another aspect of the invention.

In order to achieve a high precision write operation, which may be defined as successfully writing only targeted memory cells in the memory array, the programming current is preferably precisely controlled while the programming current pulse is applied to the selected programming line. As programming pulses can be relatively short in duration (e.g., less than ten nanoseconds (ns)), the capacitive load $C_L$ on the programming current path (see FIG. 4) has an even greater influence on the write operation, not merely in terms of speed, but in terms of other factors as well (e.g., yield, reliability, etc.).

With reference again to FIG. 4, capacitance $C_L$ represents the lumped capacitance of all capacitances in the programming current path, from the current source to the current sink, including the capacitances of the two switches 404, 408, and the conductor 406. Variations in the level of the programming current pulses, such as, for example, current spikes, can undesirably disturb the logical state of other non-targeted memory cells in the memory array, thus reducing yield and reliability. Such variations in the level of the programming current pulse can occur especially when the capacitance $C_L$ has been charged to voltages at or near the positive supply voltage, which may be VDD, and is then suddenly discharged, for example, by activation of the large current switches 404, 408.

Figure 7:
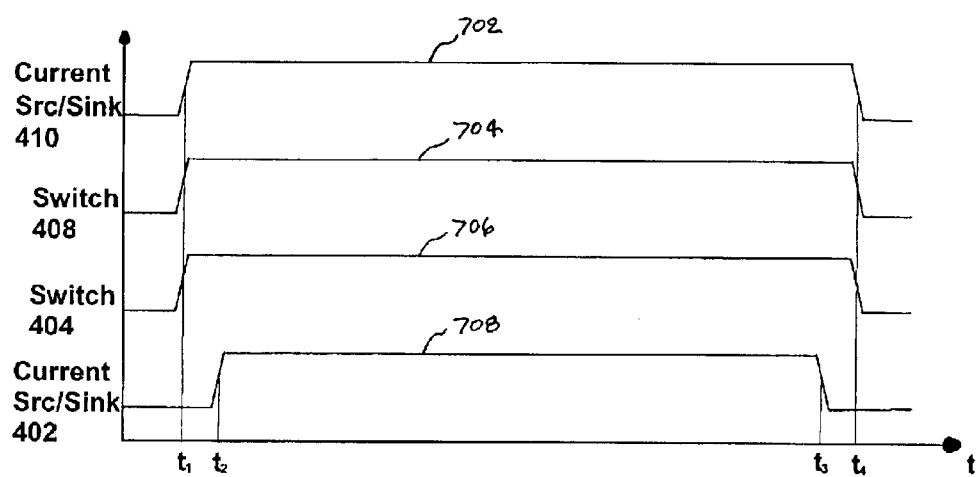
FIG. 7 is a timing diagram depicting illustrative timing signals for improving a write operation in a magnetic memory circuit, in accordance with one aspect of the invention.

In order to reduce programming current spikes, switches 404, 408 are preferably enabled and/or disabled using the illustrative control signals shown in the exemplary timing diagram of FIG. 7. With reference to FIG. 7, the exemplary control signals 702, 704, 706 and 708 are preferably used for activating and/or deactivating current source/sink 410, second switch 408, first switch 404 and current source/sink 402, respectively, depicted in FIG. 4. It is to be appreciated that alternative control signals may also be employed, in accordance with the techniques of present invention described herein. It is assumed that the programming current (e.g., $I_{PRGL}$) flows from current source/sink 402, which may be configured as a controlled current source, through the conductor 406, and into current source/sink 410, which may be configured as a current sink (e.g., a shunt to ground).

By way of example, only, in a first step, current source/sink 410, second switch 408, and first switch 404 are activated at time $t_1$. Subsequently, current source/sink 402 is activated at time $t_2$, where $t_2$ is greater than $t_1$. Current source/sink 402 substantially charges the programming current path, which includes first and second switches 404, 408, and conductor 406, and provides an exponentially increasing programming current until a quiescent state is achieved sometime after $t_2$. The amount of time required for the programming current path to charge to its quiescent state will be dependent upon characteristics associated with the programming current path, such as, but not limited to, distributed capacitance, resistance, etc. At time $t_3$, where $t_3$ is greater than $t_2$, current source/sink 402 is deactivated. Stored charge in the programming current path will exponentially discharge through current source/sink 410, which remains connected. After substantially discharging the programming current path, first switch 404, second switch 408, and current source/sink 410 can be deactivated at time $t_4$, where $t_4$ is greater than $t_3$. In this manner, current spikes associated with the switching of first and second switches 404, 408, respectively, may be substantially eliminated.

At least a portion of the magnetic memory circuit and/or improved programming circuit of the present invention may be implemented in a semiconductor device, which may comprise one or more of such magnetic memory and/or programming circuits. The techniques of the invention described herein may be used either individually or in combination to achieve improvements over conventional magnetic memory architectures. For example, the exemplary programming circuit depicted in FIG. 6 may be used in place of the write circuits in FIG. 3, including bit line programming current source/sink 306 and write bit switches 312, to reduce the load capacitance associated with the write path. To avoid confusion over a multiplicity of current sources, the prior art requires a current source dedicated to each datum input in the bit line dimension. By contrast, the invention, in one embodiment, requires a plurality of current sources/sinks for each datum input in the bit line dimension.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A magnetic memory circuit, comprising:

a plurality of memory cells;

a plurality of bit lines coupled to the memory cells for selectively accessing one or more of the memory cells;

at least one bit line programming circuit configurable as at least one of a current source for generating a programming current for writing a logical state of at least one memory cell, and a current sink for returning the programming current;

a first set of switches being disabled at least during a read operation of the memory cells and at least a portion of the first set of switches being selectively enabled during a write operation of the memory cells, each switch in the first set of switches being configured to selectively couple the at least one bit line programming circuit to a corresponding one of the bit lines in response to a first control signal;

at least one sense amplifier; and a second set of switches being disabled at least during a write operation of the memory cells and at least a portion of the second set of switches being selectively enabled during a read operation of the memory cells, each switch in the second set of switches being configured to selectively couple the at least one sense amplifier to a corresponding one of the bit lines in response to a second control signal.

2. The circuit of claim 1, wherein each of the first and second set of switches comprises a field-effect transistor (FET).

3. The circuit of claim 2, wherein the FET in each of the second set of switches is sized to be at least four times smaller than the FET in each of the first set of switches.

4. A magnetic memory circuit, comprising:

a plurality of memory cells;

a plurality of bit lines and words lines coupled to the memory cells for selectively accessing one or more of the memory cells;

at least one programming current source/sink being configurable as at least one of a current source for generating a programming current for writing a logical state of one or more memory cells, and a current sink for returning the programming current;

a plurality of first switches, each of the first switches including a first terminal coupled to a corresponding bit line, a second terminal coupled to the at least one programming current source/sink, and at least one control input for receiving a first control signal, each of the first switches coupling the corresponding bit line to the at least one programming current source/sink in response to the first control signal;

at least one sense amplifier; and a plurality of second switches, each of the second switches including a first terminal coupled to an input of the at least one sense amplifier, a second terminal coupled to a corresponding bit line, and at least one control input for receiving a second control signal, each of the second switches coupling the corresponding bit line to the input of the at least one sense amplifier in response to the second control signal.

5. The circuit of claim 4, wherein:

the first control signal comprises an address; and each of at least a portion of the plurality of first switches comprises decode circuitry coupled to the control input, the decode circuitry being configurable for decoding the address and selectively coupling the corresponding bit line to the output of the at least one programming current source/sink in response thereto.

6. The circuit of claim 4, wherein:

the second control signal comprises an address; and each of at least a portion of the plurality of second switches comprises decode circuitry coupled to the control input, the decode circuitry being configurable for decoding the address and selectively coupling the corresponding bit line to the input of the at least one sense amplifier in response thereto.

7. The circuit of claim 4, further comprising a decoder including at least one input for receiving an address, the decoder being configurable for generating the first and second control signals in response to the address.

8. The circuit of claim 4, wherein:

the plurality of first switches are arranged into a plurality of subsets in a same dimension, each subset including at least one switch; and the at least one programming current source/sink comprises a plurality of current sources/sinks, each of the current sources/sinks being coupled to a corresponding subset and being assigned to a corresponding datum input, wherein a load capacitance on an output of each of the plurality of current sources/sinks is reduced.

9. The circuit of claim 8, further comprising a decoder including at least one control input, for receiving a third control signal, and a plurality of outputs, wherein at least a portion of the plurality of current sources/sinks, each of the outputs being coupled to a control input of a corresponding one of the current sources, the decoder being configurable for selecting one of the current sources in response to the control signal.

10. The circuit of claim 8, wherein each of the plurality of current sources/sinks are substantially matched to one another.

11. The circuit of claim 8, wherein at least a portion of the plurality of current sources/sinks are located in close relative proximity to the memory cells corresponding thereto.

12. The circuit of claim 4, wherein each of at least a portion of the plurality of memory cells comprises a magnetic tunnel junction (MTJ) device.

13. The circuit of claim 4, wherein each of at least a portion of the plurality of first switches and the plurality of second switches comprises a field-effect transistor.

14. The circuit of claim 4, further comprising:
at least a second sense amplifier; and
a multiplexer including at least one control input for receiving a third control signal, an output, and a plurality of data inputs, each of the data inputs being coupled to an output of a corresponding one of the sense amplifiers, the multiplexer being configurable for selecting one of the sense amplifiers in response to the third control signal.

15. A programming circuit for use in a magnetic memory array comprising a plurality of memory cells and a plurality of programming lines operatively coupled to the memory cells for selectively accessing one or more of the memory cells, the programming circuit comprising:
a plurality of switches, each of the switches being coupled to a corresponding one of the programming lines;
a plurality of current sources/sinks, each of the current sources/sinks being coupled to a subset of one or more switches in a same dimension and being configurable as at least one of a current source for generating a programming current for writing a logical state of one or more memory cells, and a current sink for returning the programming current; and
a first decoder including at least one control input, for receiving a first control signal, and a plurality of outputs, each of the outputs being coupled to a corresponding one of the switches, the first decoder being configurable for selecting one of the switches in response to the first control signal;
wherein an overall load capacitance associated with the plurality of switches is divided among the plurality of current sources/sinks, thereby reducing a load capacitance on at least one of the current sources/sinks.

16. The programming circuit of claim 15, further comprising a second decoder including at least one control input, for receiving a second control signal, and a plurality of outputs, each of the outputs coupled to a corresponding one of the current sources/sinks, the second decoder being configurable for at least one of selectively enabling and disabling one or more of the current sources/sinks in response to the second control signal.

17. The programming circuit of claim 15, wherein the second control signal comprises at least a portion of the first control signal.

18. The programming circuit of claim 15, wherein each of the current sources/sinks is substantially matched to one another.

19. The programming circuit of claim 15, wherein the plurality of switches are divided substantially equally among the plurality of current sources/sinks.

20. The programming circuit of claim 15, further comprising:
at least one sense amplifier; and
a plurality of second switches, each of the second switches including a first terminal coupled to an input of the at least one sense amplifier, a second terminal coupled to a corresponding one of the programming lines, and at least one control input for receiving a second control signal, each of the second switches coupling the corresponding programming line to the input of the at least one sense amplifier in response to the second control signal.

21. The programming circuit of claim 20, wherein:
the second control signal comprises an address; and
at least one of the second switches comprises decode circuitry coupled to the control input, the decode circuitry being configurable for decoding the address and selectively coupling the corresponding programming line to the input of the at least one sense amplifier in response thereto.

22. An integrated circuit including at least one magnetic memory circuit comprising:
a plurality of memory cells;
a plurality of bit lines coupled to the memory cells for selectively accessing one or more of the memory cells;
at least one bit line programming circuit configurable as at least one of a current source for generating a programming current for writing a logical state of at least one memory cell, and a current sink for returning the programming current;
a first set of switches being disabled at least during a read operation of the memory cells and at least a portion of the first set of switches being selectively enabled during a write operation of the memory cells, each switch in the first set of switches being configured to selectively couple the at least one bit line programming circuit to a corresponding one of the bit lines in response to a first control signal;
at least one sense amplifier; and
a second set of switches being disabled at least during a write operation of the memory cells and at least a portion of the second set of switches being selectively enabled during a read operation of the memory cells, each switch in the second set of switches being configured to selectively couple the at least one sense amplifier to a corresponding one of the bit lines in response to a second control signal.

23. The integrated circuit of claim 22, wherein:
the first set of switches are arranged into a plurality of subsets in a same dimension, each subset including at least one switch; and
the at least one bit line programming circuit comprises a plurality of current sources/sinks, each of the current sources/sinks being coupled to a corresponding subset and being assigned to a corresponding datum input, wherein a load capacitance on an output of each of the plurality of current sources/sinks is reduced.

24. The integrated circuit of claim 22, wherein the at least one magnetic memory circuit further comprises:
at least a second sense amplifier; and
a multiplexer including at least one control input for receiving a third control signal, an output, and a plurality of data inputs, each of the data inputs being coupled to an output of a corresponding one of the sense amplifiers, the multiplexer being configurable for selecting one of the sense amplifiers in response to the third control signal.

25. An integrated circuit including at least one programming circuit for use in a magnetic memory array comprising a plurality of memory cells and a plurality of programming lines operatively coupled to the memory cells for selectively accessing one or more of the memory cells, the programming circuit comprising:
a plurality of switches, each of the switches being coupled to a corresponding one of the programming lines;
a plurality of current sources/sinks, each of the current sources/sinks being coupled to a subset of one or more switches in a same dimension and being configurable as at least one of a current source for generating a programming current for writing a logical state of one or more memory cells, and a current sink for returning the programming current; and a first decoder including at least one control input, for receiving a first control signal, and a plurality of outputs, each of the outputs being coupled to a corresponding one of the switches, the first decoder being configurable for selecting one of the switches in response to the first control signal;

wherein an overall load capacitance associated with the plurality of switches is divided among the plurality of current sources/sinks, thereby reducing a load capacitance on at least one of the current sources/sinks.

26. The integrated circuit of claim 25, wherein the at least one programming circuit further comprises:

at least one sense amplifier; and a plurality of second switches, each of the second switches including a first terminal coupled to an input of the at least one sense amplifier, a second terminal coupled to a corresponding one of the programming lines, and at least one control input for receiving a second control signal, each of the second switches coupling the corresponding programming line to the input of the at least one sense amplifier in response to the second control signal.

* * * * *

UNITED STATES PATENT AND TRADEMARK OFFICE
CERTIFICATE OF CORRECTION

PATENT NO.        : 6,778,431 B2
APPLICATION NO. : 10/318709
DATED             : August 17, 2004
INVENTOR(S)       : Gogl et al.

It is certified that error appears in the above-identified patent and that said Letters Patent is hereby corrected as shown below:

On the Title Page:
Item (73)

Please include assignee:

--Infineon Technologies North America Corp., San Jose, CA (US)--

Signed and Sealed this

Fourteenth Day of November, 2006

JON W. DUDAS
*Director of the United States Patent and Trademark Office*